United States Patent [19]
Gill

[11] Patent Number: 5,565,371
[45] Date of Patent: Oct. 15, 1996

[54] METHOD OF MAKING EPROM WITH SEPARATE ERASING AND PROGRAMMING REGIONS

[75] Inventor: Manzur Gill, Arcola, Tex.

[73] Assignee: Texas Instruments Incorporated, Dallas, Tex.

[21] Appl. No.: 467,199

[22] Filed: Jun. 6, 1995

Related U.S. Application Data

[62] Division of Ser. No. 265,990, Jun. 27, 1994, abandoned, which is a continuation of Ser. No. 723,737, Jun. 20, 1991, abandoned, which is a continuation of Ser. No. 507,823, Apr. 12, 1990, abandoned.

[51] Int. Cl.$^6$ .............................................. H01L 21/8247
[52] U.S. Cl. ................... 437/43; 437/52; 437/193
[58] Field of Search .................. 437/43, 48, 52, 437/193

[56] References Cited

U.S. PATENT DOCUMENTS

| | | | |
|---|---|---|---|
| 5,032,533 | 7/1991 | Gill et al. | 437/43 |
| 5,045,491 | 9/1991 | Gill et al. | 437/52 |
| 5,057,446 | 10/1991 | Gill et al. | 437/43 |
| 5,371,031 | 12/1994 | Gill et al. | 437/52 |

*Primary Examiner*—George Fourson
*Assistant Examiner*—Richard A. Booth
*Attorney, Agent, or Firm*—Theodore D. Lindgren; Leo N. Heiting; Richard L. Donaldson

[57] ABSTRACT

An electrically-erasable, electrically-programmable, read-only-memory cell array is formed in pairs at a face of a semiconductor substrate (21). Each memory cell includes a source region (11) and a drain region (12) formed in a shared drain-column line (19), with a corresponding channel region in between. A Fowler-Nordheim tunnel-window (13a) is located opposite the channel over the source-column line (17) connected to source (11). A floating-gate conductor (13) includes a channel section (29) and a tunnel-window section (28). The floating-gate conductor is formed in two stages, the first stage forming the channel section (29) and the tunnel-window section (28) from a first-level polysilicon. This floating-gate channel section (29) is used as a self-alignment implant mask for the source (11) and drain (12) regions, such that the channel-junction edges are aligned with the corresponding edges of the channel section (29). A control-gate cenductor 14 is disposed over the floating-gate conductor (13), insulated by an intervening inter-level dielectric (26). The memory cell is programmed by hot-carrier injection from the channel to the floating-gate channel section (29), and erased by Fowler-Nordheim tunneling from the floating-gate tunnel-window section (28) through the tunnel window (13a). The program, erase and read regions of the cells are physically separate from each other, and the characteristics of each of those regions may be made optimum independently from each other.

10 Claims, 3 Drawing Sheets

METHOD OF MAKING EPROM WITH SEPARATE ERASING AND PROGRAMMING REGIONS

This application is a divisional of Ser. No. 08/265,990, filed Jun. 27, 1994, now abandoned, which is a continuation of Ser. No. 07/723,737, filed Jun. 20, 1991, now abandoned, which is a continuation of Ser. No. 07/507,823, filed Apr. 12, 1990, now abandoned.

RELATED APPLICATIONS

This application discloses subject matter also disclosed in co-pending U.S. patent applications Ser. No. 07/295,079, filed Jan. 9, 1989, now abandoned; Ser. No. 07/219,530, filed Jul. 15, 1988, now abandoned; Ser. No. 07/219,528, filed Jul. 15, 1988, now abandoned; Ser. No. 07/219,529, filed Jul. 15, 1988, now abandoned; and Ser. No. 07/374,381, filed Jun. 30, 1989, now abandoned; Ser. No. 07/457,990, filed Dec. 28, 1989, now U.S. Pat. No. 4,994,403 and Ser. No. 07/458,936, filed Dec. 29, 1989, now U.S. Pat. No. 5,010,028 assigned to Texas Instruments Inc., the assignee of this invention. The foregoing applications are incorporated herein by reference.

BACKGROUND OF THE INVENTION

The present invention relates to a nonvolatile, integrated-circuit memory such as an electrically-erasable, electrically-programmable read-only-memory (EEPROM), and more particularly to an EEPROM memory cell that is programmed by hot-carrier injection and is erased by Fowler-Nordheim tunneling, and to a method of fabricating such a device.

EEPROMs use field-effect transistors with floating-gate structures which are programmed and erased by storing and removing charges from the electrically isolated floating gates. The digital information stored in EEPROMs is read by differentiating between the source-drain impedance presented by a charged (high Vt) floating gate and an uncharged (low Vt) floating gate. Depending on construction, EEPROMs may be erased cell-by-cell, segment-by-segment, all cells at one time (flash-erase mode), or combinations of the foregoing.

In general, EEPROMs use one of two charge transfer mechanisms for programming operations—either Fowler-Nordheim tunneling or hot-carrier injection. Fowler-Nordheim tunneling is generally used for erase operations. EEPROMs using hot-carrier injection programming typically employ FAMOS (Floating-gate, Avalanche-injection MOS) structures, although hot-carrier injection results from channel-hot electrons as well as avalanche breakdown (assuming NMOS).

Each of the two charge transfer mechanisms has advantages and disadvantages in comparison to the other mechanism. Programming an EEPROM memory cell by hot-carrier injection requires lower voltage than the voltage required for Fowler-Nordheim tunneling. On the other hand, the higher voltage required for Fowler-Nordheim tunneling can be generated on-chip because of the relatively small tunneling-current required. In many cases, an additional power supply is required to meet the higher programming-current requirement for hot-carrier injection. Moreover, floating-gate erasure using hot-carrier injection of holes may cause damage to the oxide insulator layer, leading to cell degradation and failure. Use of Fowler-Nordheim tunneling for erasing causes significantly less damage to the tunnel-window oxide and is, therefore, preferable for cell durability and reliability.

EEPROMs using hot-carrier injection for programming and using Fowler-Nordheim tunneling for erasure have been described in: (a) "A Single Transistor EEPROM cell and its implementation in a 512K CMOS EEPROM," S. Mukherjee, et al., IEDM 1985 (p. 616–619), (b) "An In-System Reprogrammable 256K CMOS Flash Memory", V. N. Kynett, et al., ISSCC 1988 (p. 132–133), and (c) "A 128K Flash EEPROM using double polysilicon Technology", George Samachisa et al., ISSCC 1987 (p. 87–88). These EEPROMs employ a conventional architecture in which the drains of two memory cells share one contact. Gate oxide thickness is a trade-off between adequate tunneling current for erase in a reasonable time, and the impact on yields/reliability from processing defects. That is, thick gate oxide improves process yields/reliability, but reduces tunnel current, which leads to long erase times. Moreover, the junction breakdown voltage is lowered with thin gate oxide, so that, during erase, excessive junction leakage (and the unwanted generation of hot carriers) can occur before the onset of adequate Fowler-Nordheim tunnel erase current. (See, References (b) and (c).) Thus, these EEPROMs are erased, in part, by hot holes because of low field plate breakdown voltage of the source-channel junction of the floating-gate transistor.

The approach in Reference (c) uses a channel oxide of about 200 Angstroms, and uses channel-hot-electron injection for programming, and Fowler-Nordheim tunneling for erasure from the same junction. It has two disadvantages: (i) the junction optimization requirements for erasing/programming are incompatible, and cannot be met by the same junction; and (ii) a gate oxide thickness of 200 Angstroms does not allow adequate Fowler-Nordheim tunneling current for reasonable erase times with conventional 12.5 V EEPROM power supplies. As a result, junction-breakdown-assisted erase can occur, leading to excessive substrate current during erase.

Thus, EEPROMs, heretofore, have not combined hot-carrier injection programming with strictly Fowler-Nordheim tunnel erasing. One problem has been that the higher voltages required by Fowler-Nordheim tunnel erasing leads to source-channel junction field-plate breakdown, and the unwanted generation of hot carriers. Related application Ser. No. 07/219,529, now abandoned, discloses a memory cell configuration in which a Fowler-Nordheim tunnel window is located on a side of the source opposite the channel, and the junction under the tunnel window terminates under a relatively thick oxide, thereby improving source-junction field-plate breakdown.

Accordingly, a need exists for an EEPROM that is programmed using only hot-carrier injection, and is erased using only Fowler-Nordheim tunneling, in a contact-free array configuration. Such an EEPROM would take advantage of the relatively low voltage required for hot-carrier injection programming while avoiding channel insulator damage due to hot-carrier erasure, thereby improving the durability and reliability of the memory cell. In addition, the reduced number of array contacts would provide improved process yields and improved reliability. In general, a satisfactory memory cell of this type would provide careful control over the channel and junction profile to achieve optimum efficiency for hot-carrier-injection programming.

Related application Ser. No. 07/458,936, now U.S. Pat. No. 5,010,028 discloses a structure and method for a buried-bitline-type of EEPROM that is programmed by hot-carrier injection and that is erased by Fowler-Nordheim tunnelling. The structure and method of this invention provide alternatives to the structure and method of that invention. In particular, the floating-gate structure of this invention has three sections, rather than the two sections shown in the aforementioned related application. The third section, or tunnel-window section, provides protection for the Fowler-Nordheim tunnel-window during latter stages of the construction process.

SUMMARY OF THE INVENTION

The present invention provides increased durability of an EEPROM cell by using hot-carrier injection for programming and by using Fowler-Nordheim tunneling for erasing. The efficiency of injection programming is made optimum by a suitably profiled channel with an abrupt drain-channel junction, while substrate leakage and hot-carrier-injection erasure is suppressed by a tunnel-window configuration that increases the source-junction field-plate breakdown voltage. Moreover, the programming junction structure and the erase junction structure may be made optimum independently.

A floating-gate conductor is disposed over and insulated from the channel region for controlling the channel conductivity. The floating gate includes a tunnel-window section disposed over and insulated from the source-column line for establishing a Fowler-Nordheim tunnel-current path. The floating gate also includes a channel section of a predetermined length, which is used during fabrication to align the source/drain junctions. A connecting section of the floating gate overlies and connects the tunnel-window section and the channel section. The channel section permits the source/drain implants to be self-aligned, provides effective control of channel length, and facilitates junction profiling (such as by doping optimization and/or subsequent controlled heat treatment cycles) to create abrupt drain-channel junctions, thereby increasing the efficiency of hot-carrier injection for programming. A control-gate conductor is disposed over and insulated from the floating gate.

A thick-oxide insulator is formed over the source-column lines. A tunnel window is formed between the source-column thick-oxide insulators and a cell-isolation thick-oxide insulator. A tunnel-window implant is used to profile the tunnel-window subregion of the source-column line. The tunnel-window insulator is substantially thinner than the gate insulator over the channel region (about 100 Angstroms compared to about 200–400 Angstroms).

The floating gates are formed in two stages. In the first stage, a first-level conductive polysilicon layer is formed over a channel-oxide layer, and then patterned and etched to define parallel channel-section strips and to define parallel tunnel-window-section strips. The channel-section strips are of a predetermined width, and each is used as a self-aligned implant mask for implanting in the substrate of first conductivity-type source regions of and drain-column lines of a second conductivity-type on either side. Junction profile implants may be used to create an abrupt drain-channel junction (made optimum for programming) and a sloped (graded) source-channel junction (made optimum for reading). Before the polysilicon channel-section strips are formed, one or more channel implants may be used to profile the channel regions (including use of a voltage-threshold-adjust implant).

In the second stage of floating-gate fabrication, the tops of the remaining parts of the channel-section strip and the tunnel-window-section strip are cleared, followed by the formation of a second-level polysilicon layer. The second-level polysilicon layer is patterned and etched into connecting-section strips that each extend over the channel-section strips, the tunnel-window-section strips and the source-column-line thick oxide insulator, defining the length of the floating gates. A third-level conductive polysilicon layer is formed over the substrate, insulated from the connecting-section strips by an inter-level insulator layer.

A stack-etch procedure is used to define wordlines and floating gates for each row of memory cells. Each wordline includes control-gate conductors, which are capacitively coupled (through the inter-level insulator) to the floating gates for each memory cell in that wordline row. Each floating-gate conductor extends across most of a memory cell, maximizing capacitive coupling to the overlying control-gate conductor.

During cell programming, appropriate programming voltages applied to selected and deselected control-gate wordlines and source/drain bitlines create a high-current condition in the selected channel region, injecting channel-hot electrons and/or avalanche-breakdown electrons across the channel oxide to the floating gate. During cell erasing, appropriate erasing voltages applied to the selected and deselected control-gate wordlines and source/drain-column lines allow a Fowler-Nordheim tunnel current across the tunnel-window insulator to remove a selected charge from the floating gate, without causing hot-carrier erasure from source-junction field-plate breakdown.

The technical advantages of the injection-program/tunnel-erase EEPROM cell of this invention include the following: (1) The memory cells are contact-less, saving chip area and improving manufacturing yield, and allowing a relatively planar topology. (2) The memory cell uses hot-carrier injection for programming, allowing lower programming voltages than those required for Fowler-Nordheim tunneling. (3) It uses Fowler-Nordheim tunneling for erasing, avoiding damage to the channel oxide from hot-carrier erasure. (4) It uses a two-stage floating-gate fabrication technique in which a floating-gate channel section (P1A) is used to self-align the source/drain junctions, and profile the channel and the channel junctions for optimum injection efficiency. (5) The two-stage floating-gate fabrication technique increases capacitive coupling between a control-gate wordline and the floating-gate P1B layer by maximizing overlap over the thick oxide covering the source-column bitline. (6) The memory cell is fabricated with a tunnel window located adjacent the source region opposite the source-channel junction, thereby enhancing the field-plate breakdown voltage for the source-channel junction and inhibiting hot carrier injection during erasing because the junction under the tunnel window terminates under a relatively thick oxide. (7) The source-channel junction, the drain-channel junction, and the tunnel region can be made optimum separately for reading, programming and erasing respectively. (8) Since programming can be done from the middle diffusion adjacent relatively thicker gate oxide, deprogramming due to bitline stress can be avoided.

BRIEF DESCRIPTION OF THE DRAWINGS

For a more complete understanding of the present invention, and for other features and advantages, reference is now made to the following description, read in conjunction with the accompanying drawings, in which:

FIG. 2b is an enlarged elevation view of the part of the memory cell array of FIG. 2a taken along lines b—b of FIG. 2a.

DETAILED DESCRIPTION OF THE INVENTION

Figure 1:
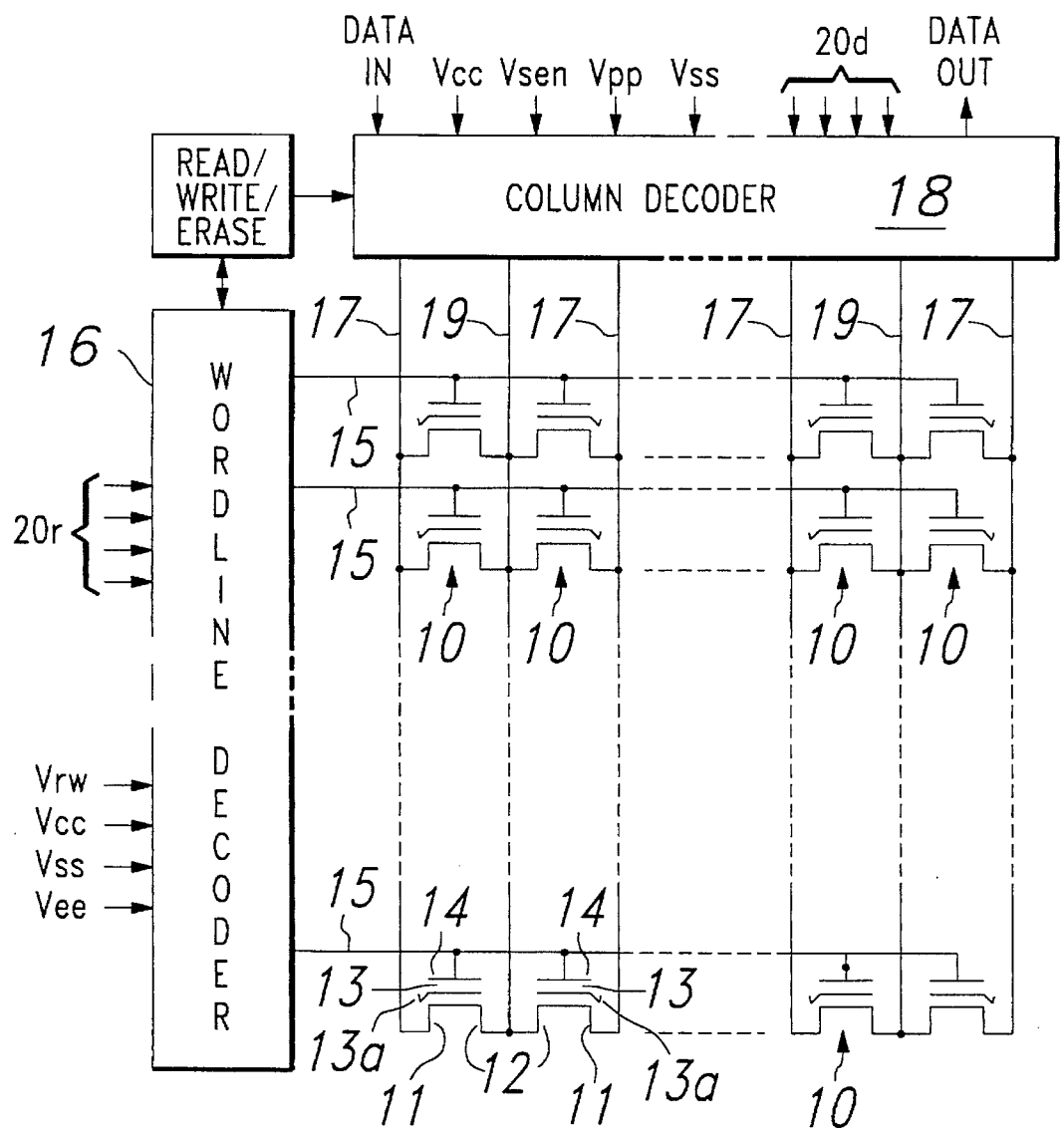
FIG. 1 is an electrical schematic diagram, in partial block form, of a memory cell array.

Referring to FIG. 1, an example array of memory cells, which is an integral part of a memory chip, is shown for the purpose of illustrating use of the circuit of this invention. Each cell is a floating-gate transistor 10 having a source 11, a drain 12, a floating gate 13 and a control gate 14. Each floating gate 13 has a Fowler-Nordheim tunneling window 13a that is disposed near the source 11. Each of the control gates 14 in a row of cells 10 is connected to a wordline 15, and each of the wordlines 15 is connected to a wordline decoder 16. Each of the source electrodes 11 in a column of cells 10 is connected to a source-column line 17, and each of the source-column lines 17 is connected to a column decoder 18. Each of the drain electrodes 12 in a column of cells 10 is connected to a drain-column line 19, and each of the drain-column lines 19 is connected to the column decoder 18.

In a write or program mode, the wordline decoder 16 may function, in response to wordline address signals on lines 20r, to place a preselected first programming voltage Vrw (approx. +10 V) on a selected wordline 15, including a selected control-gate conductor 14. Column decoder 18, in response to signals on lines 20d, functions to place a preselected second programming voltage Vss (or ground) on a selected source-column line 17, including the source 11 of the selected cell 10. Column decoder 18 also functions to place a third programming voltage Vpp (approx. +5 to +10 V) on a selected drain-column line 19, which includes the drain region 12 of selected cell 10. All of the deselected drain-column lines 19 and source-column lines 17 are allowed to float. These programming voltages create a high current (source 11 to drain 12) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate with a negative program charge of approximately −2 V to −6 V with respect to the channel region. For memory cells 10 fabricated in accordance with the preferred embodiment, the coupling coefficient between a control gate 14/wordline 15 and a floating gate is approximately 0.6. Therefore, a programming voltage Vrw (approx. +10 V) on a selected wordline 15, including the selected control gate 14, places a voltage of approximately +6 V on the selected floating gate 13. The voltage difference between the floating gate 13 (at approx. +6 V) and the grounded (0 v) selected source-column line 17, including the selected source 11, is insufficient to cause a Fowler-Nordheim tunneling current across region 13a to charge the floating gate 13 of the selected cell 10. The floating gate 13 of the selected cell 10 is charged with electrons during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

An alternative programming method is to bring all deselected sources/drains 11,12 not common to the selected cell 10 pair to Vss (or ground), while the deselected source 11 common to the selected cell 10 pair is left floating.

In a flash erase mode, the column decoder 18 functions to apply a positive voltage Vcc (approx. +5 V) to all the source-column lines 17. The column decoder 18 also functions to leave all drain-column lines 19 floating. The wordline decoder 16 functions to apply a high negative voltage Vee (approx. −10 V) to all the wordlines 15. These erasing voltages create sufficient field strength across the tunneling region 13a to generate a Fowler-Nordheim tunnel current that transfers charge from the floating gate, erasing the memory cell 10. Because of the negative potential on the wordline 15, the cell 10 remains in the nonconducting state during erase, and therefore, no channel-hot carriers are generated. The field-plate breakdown voltage of the source-column line junction has been made high enough to inhibit hot-carrier injection. The high field-plate breakdown voltage of the tunnel junctions is achieved by terminating the junction under a relatively thick oxide.

In the read mode, the wordline decoder 16 functions, in response to wordline address signals on lines 20r, to apply a preselected positive voltage Vcc (approx. +5 V) to the selected wordline 15, and to apply a low voltage (ground or Vss) to deselected wordlines 15. The column decoder 18 functions to apply a preselected positive voltage Vsen (approx. +1.5 V) to at least the selected drain-column line 19. The column decoder 18 also functions, in response to signal on address lines 20d, to connect the selected source-column line 17 of the selected cell 10 to the DATA OUT terminal. The conductive or nonconductive state of the cell 10 connected to the selected drain-column line 19 and the selected wordline 15 is detected by a sense amplifier (not shown) connected to the DATA OUT terminal. These read voltages are sufficient to determine channel impedance for the selected cell 10 but insufficient to create either hot-carrier injection or Fowler-Nordheim tunneling that would disturb the charge condition of any floating gate 13.

The voltages applied to the source 11 and drain 12 regions in the read example above are interchangeable. In addition, programming may be performed at the source region 11 with corresponding changes in other voltages. Also, programming and erasing may both be performed at the source region 11.

For convenience, a table of read, write and erase voltages is given in the TABLE I below:

TABLE I

|  | Read | Write | Flash Erase |
| --- | --- | --- | --- |
| Selected Wordline | 5 V | 10 V | −10 V (All) |
| Deselected Wordlines | 0 V | 0 V | — |
| Selected Source Line | 1.5 V | 0 V | 0 V (All) |
| Deselected Source Lines | Float | Float | — |
| Selected Drain Line | 0 V | 5–10 V | Float (All) |
| Deselected Drain Lines | Float | Float | — |

The preferred embodiment of this invention is described in connection with an NMOS contact-less EEPROM array in which wordline 15 rows of memory cells 10 are configured in memory cell 10 pairs with two source-column lines 17 and a shared intermediate drain-column line 19. This cell 10 pair mirror-image configuration is described in the related applications. This invention is routinely adaptable to any floating-gate field-effect type EEPROMs.

Figure 2A:
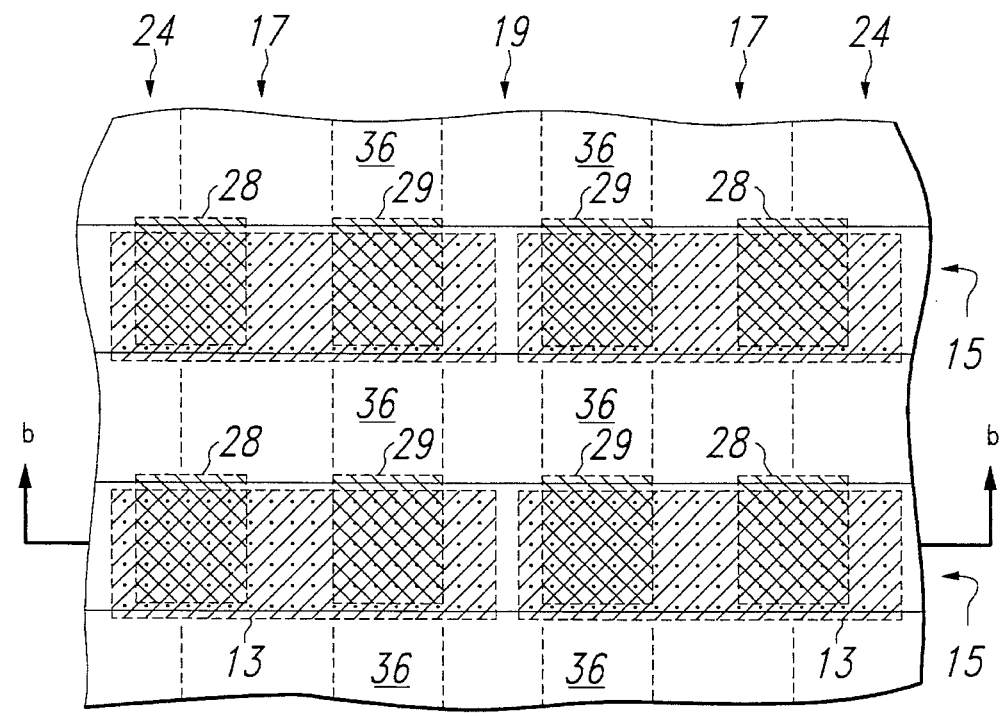
FIG. 2a is an enlarged plan view of a small part of a memory cell array of this invention.
Figure 2B:
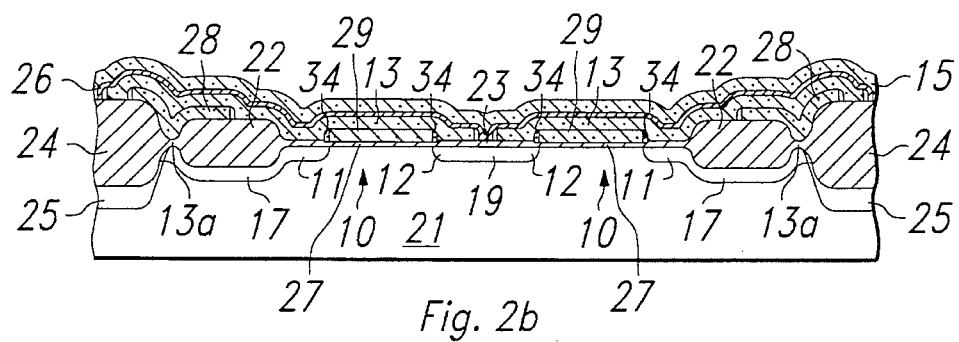

Referring now to FIGS. 2a–b, an array of electrically-erasable and programmable memory cells 10 is formed in a face of a P-type silicon substrate 21. Multiple conductive wordlines 15, each defining a row of memory cells 10, are formed on the face of the substrate 21. A pair of buried N+ source-column lines 17 and an intermediate buried N+ drain-column line 19 define a column of memory cell 10 pairs. The source-column lines 17 are N+ regions buried under columnar thick-insulator regions 22. The drain-column lines 19 are N+ regions buried under insulator layer 23. Cell-isolation thick-field insulator columns 24 and channel isolation stop regions 25 provide isolation between adjacent source-column lines 17, as well as between adjacent columns of cells 10.

A wordline 15 includes control-gate conductors 14 for the memory cells 10 in the wordline 15 row. Floating-gate conductors 13 extend across a memory cell 10 (aligned with a respective wordline 15/control gate 14), over the channel between source 11 and drain 12 and over a tunnel-window section 13a. The wordlines 15 are actually aligned in the wordline 15 direction with the floating-gate conductors 13. The slight offset depicted in the FIG. 2a is for the purpose of clarity.

As shown in FIG. 2b, the buried N+ source-column line 17 may be extended to include a source region 11, while the shared buried N+ drain-column line 19 includes drain regions 12. The buried source-column line 17 underlies a tunnel-window insulator 13a that separates the source-column line 17 from floating gate 13.

Tunnel-window insulator 13a is self-aligned between the source-column-line thick-insulator regions 22 and the cell-isolation thick insulators 24, defining a Fowler-Nordheim tunnel region.

For each memory cell 10, wordline 15 includes a control gate conductor 14. An underlying floating-gate conductor 13 is insulated from the control gate conductor 14 by an inter-level dielectric insulator (e.g., oxide) layer 26, and from the channel region by the gate insulator (e.g., oxide) layer 27. Thus, each memory cell 10 pair includes two floating-gate field-effect transistors 10 formed by a common wordline 15 including respective control-gate conductors 14, respective floating gates 13, respective sources 11 (adjacent to source-column lines 17), drains 12 (included in common drain-column line 19), and respective channel regions under gate insulator layers 27.

Each floating-gate conductor 13 is formed in two stages using separate first- and second-level polysilicon layers. The first-level polysilicon layer includes a tunnel-window section 28 that covers the tunnel window 13a and includes a channel section 29 that is used to self-align the source/drain regions 11,12 as well as define the channel length. The second-level polysilicon layer, designated 13, extends across the cell 10, electrically connecting the tunnel-window section 28 and the channel section 29 of the first polysilicon layer.

The floating-gate channel section 29 is capacitively coupled to the channel region through a relatively thin gate insulator 27 (about 200–400 Angstroms of oxide), and the tunnel-window section 28 is capacitively coupled to the source-column line 17 through an even thinner (about 100 Angstroms) tunnel-window insulator 13a. The capacitive coupling between the control gate 14 and the floating gate 13 is enhanced by extension of the control gate 14 from the cell-isolation thick-field insulator 24 to the drain-column line insulator 23, including the thick-insulator region 22 burying the N+ source-column line 17.

Various implant procedures can be used to tailor the junctions of the source/drain regions 11,12 for optimum programming and reading efficiency. For programming efficiency, the drain-channel junction is tailored to exhibit an abrupt profile that facilitates hot-carrier injection. For disturb-free reading, the source-channel junction is tailored to exhibit a sloped (graded) profile.

The memory cells 10 are contact-free, in that no electrical contacts near the source 11 or drain 12 are used. As described in the related application, Ser. No. 07/374,381, filed on Jun. 30, 1989, contacts are made between the diffused source- and drain-column lines 17 and 19 and respective metal contact column lines or bitlines overlying them.

The memory cell 10 pair configuration of the preferred embodiment is not critical to the present invention, but is a matter of routine design choice. Alternative memory cell 10 configurations may be adapted to use various aspects of this invention, including Fowler-Nordheim tunneling for erasing and channel and junction profiling to enhance avalanche-injection efficiency.

A method of fabricating the preferred embodiment of the injection-program/tunnel-erase EEPROM cell 10 pair is described with reference to FIGS. 3a–3f, which are cross-sectional elevation views taken along section line b—b of FIG. 2a (i.e., through approximately the center of a wordline 15). Conventional photo-lithographic techniques well known in the art are used. These figures, and the various layers and areas, are not drawn to any absolute or relative scale, but are for illustrative purposes only.

The starting material is a slice of P-type silicon of which the substrate 21 is only a small portion. The slice is perhaps 6 inches in diameter, while an individual member cell 10 is only a few microns wide. A number of process steps would normally be performed to create transistors peripheral to the memory array, and these will not be discussed. For example, the EEPROM memory device may be of the complementary field effect type (CMOS) having N-wells and P-wells formed in the substrate 21 as part of a prior process to create peripheral transistors.

Figure 3A:
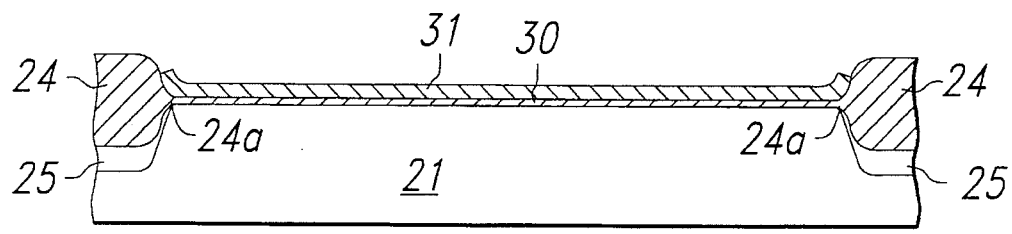
FIGS. 3a–3f are elevation views in section of the part of the memory cell array of FIGS. 2a–b at successive fabrication stages.

As shown in FIG. 3a, a pad oxide layer 30 about 400 Angstroms thick is grown or deposited on the face of substrate 21. This pad oxide protects the substrate 21 during the initial fabrication steps and will be subsequently removed. A silicon nitride layer 31 is deposited over the oxide using low pressure chemical vapor deposition. The oxide/nitride is patterned and plasma etched to define areas for memory cell 10 pairs, leaving oxide/nitride over the regions that will be the channels, tunnel windows 13a, sources 11 and drains 12, while exposing the columnar areas where the cell-isolation thick field-insulator 24 is to be formed.

A boron implant at a dose of about $8 \times 10^{12}$ cm$^{-2}$ is performed to create a P+ channel stop region 25 that will isolate the source-column lines 17 for adjacent cell 10 pairs. After removing the photoresist, the thick field oxide that forms the cell-isolation thick-field insulator 24 is thermally grown in a localized oxidation process to a thickness of about 6000–10000 Angstroms by exposure to steam at about 900° C. and one atmosphere for several hours. Alternatively, a high pressure oxidation (HIPOX) can be used to decrease oxidation time. The oxide grows beneath the edges of the nitride 31, creating "bird's beak" areas 24a instead of abrupt transitions.

Next, the remaining portions of the pad oxide/nitride layers are removed. This procedure exposes the silicon substrate 21 between the cell-isolation thick-field insulators 24, in preparation for regrowing an oxide gate insulator.

Figure 3B:
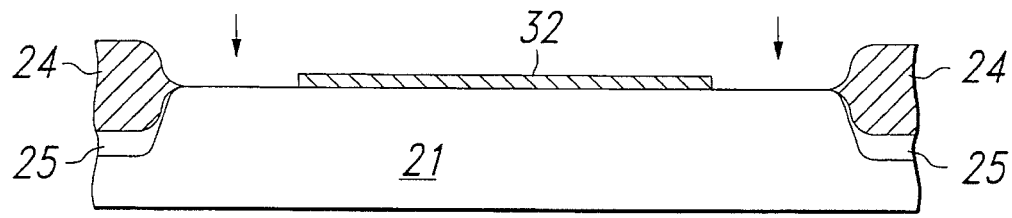

With reference to FIG. 3b, layers 30 and 31 are removed and the next step is to implant the N+ source-column lines adjacent each cell-isolation insulator 24. A layer 32 of photoresist is formed over the regions of the substrate that will become the channel regions and the drain regions 12, and perhaps the source regions 11. An arsenic implant is performed at a dosage of about $6 \times 10^{15}$ cm$^2$ at about 135 Kev to create the N+ source-column line 17 for each memory cell 10 in a corresponding column of memory-cells 10.

Following the implant of source-column lines 17, the photoresist 32 is stripped from the top of the oxide/nitride channel columns, and the substrate 21 is annealed at about 900°–1000° C. for about 30 minutes in an annealing ambient to repair the implant damage and for junction drive.

Figure 3C:
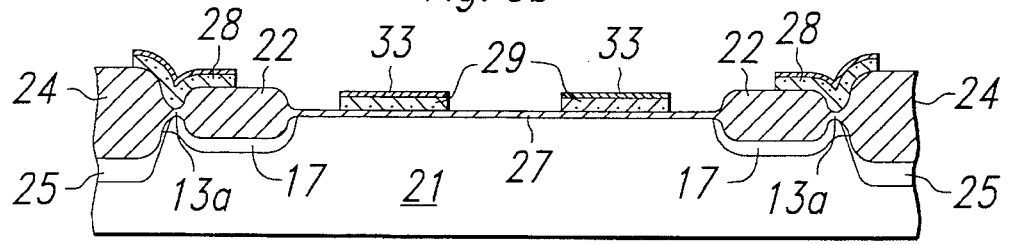

With reference to FIG. 3c, a differential silicon oxidation procedure is then performed to thermally grow source-column-line thick-insulator regions 22, burying the corresponding N+ source-column lines 17. This thermal oxidation procedure is performed with steam at about 800°–900° C. to grow thick-insulator regions 22 to a thickness of about 1500 to 3000 Angstroms in the heavily doped regions 17 (a high pressure oxidation can also be used for this step). At the same time, a thinner oxide (in the range of 150–300 Angstroms) grows in the region between thick-insulator regions 22.

At this point, with the substrate 21 surface exposed between the cell-isolation insulators 24, channel implants can be performed for channel optimization, using conventional techniques. For example, after appropriately patterning the substrate 21 face with photoresist (leaving the channel regions exposed), one or more boron implants can be used for threshold voltage adjustment of cells 10 and for tailoring junction gradation, achieving a desired channel profile (doping and depth).

This step also begins formation of the tunnel windows 13a. Due to the presence of the "bird's beak" portions 24a (see FIG. 3a) of the cell-isolation insulators 24, the arsenic implant of source-column lines 17 is partially masked, so that the concentration of the arsenic dopant in tunnel-window 13a subregions is lower than the arsenic concentration in the rest of the source-column lines 17. As a result, oxide growth in the tunnel-window 13a subregions is considerably less than the thick oxide growth over the source-column lines 17. The thickness of this intervening oxide is not important, since it will be etched and tunnel-window oxide regrown to a relatively precise thickness.

The next procedure is to form the Fowler-Nordheim tunnel windows. Photoresist is used to protect all of the surface of substrate 21 except in the areas where tunnel windows 13a are to be formed. This photoresist step exposes the region at the interface between the cell-isolation thick-field insulator 24 and the source-column-line thick-insulator region 22, i.e., above tunnel-window 13a subregions. The exposed tunnel-window 13a subregions may be implanted with phosphorus at a dosage of about $1 \times 10^{14}$ cm$^{-2}$ to $5 \times 10^{14}$ cm$^{-2}$, through the overlying oxide to create extensions or subregions of source-column line 17.

The exposed oxide covering the tunnel-window 13a subregions is then etched down to the silicon substrate 21. This etch process also correspondingly etches the exposed portions of the source-column-line thick-insulator 22, and the cell-isolation thick-field insulator 24. As an alternative to the phosphorous implant, an arsenic implant can be used after the tunnel-window etch has exposed the silicon substrate 21, followed by annealing.

The photoresist is removed, and relatively thin tunnel-window 13a oxides are then grown to a thickness of about 100 Angstroms, forming the Fowler-Nordheim tunnel windows 13a. At the same time, oxide 27 between regions 22 grows to a thickness of about 200–400 Angstroms. Because of the curved surface of the oxide in the tunnel window 13a prior to etching, the width of the regrown tunnel-window 13a oxides is controlled by varying the length of time for the etching process. This self-aligned tunnel window and method have been discussed in the related applications listed above.

Optionally, the silicon surfaces of the tunnel windows 13a can be textured by etching off about 800 Angstroms of silicon substrate 21 prior to regrowing the tunnel-window 13a oxides. The tunnel-window 13a oxides are then regrown at about 950° C. under an oxygen atmosphere containing hydrogen chloride until the desired window thickness of about 100–300 Angstroms is attained. With the silicon surface textured in this manner, the Fowler-Nordheim tunneling starting field is reduced from about 10 megavolts/cm to about 3–5 megavolts/cm for the negative or positive voltage polarities, respectively.

The first stage of the process of forming the floating-gate conductors is performed by depositing a layer of first-level polysilicon over the substrate 21 face. This first-level polysilicon layer is deposited to a thickness of about 1500–4000 Angstroms. The layer is highly doped N+ with phosphorous to render it conductive.

The first-level polysilicon layer is covered by an oxide/nitride layer 33, which may be about 100–250 Angstroms thick. Oxide is deposited (or grown by oxidation) over the first-level polysilicon layer, and nitride is deposited over the oxide, both to a thickness of about 100–400 Angstroms. The nitride provides a hard protective cover, while the oxide provides an intermediate thermal-expansion buffer layer.

The oxide/nitride layer 33 is patterned with photoresist to define channels between source regions 11 and drain regions 12 and to leave a protective coat of first-level polysilicon over tunnel windows 13a. A plasma etch procedure removes the unprotected first-level polysilicon, exposing the gate oxide areas, parts of the thick-insulator regions 22 and 24, and a region to form the source regions 11 that extend to the channel region from source-column lines 17. The remaining portion of the first-level polysilicon layer becomes tunnel-window-section 28 strip and channel section 29 of floating gate 13, which will form parts of the floating gates 13.

The channel-section 29 strips formed by the first-level polysilicon layer are configured with a predetermined length, and are used in later fabrication steps as an implant mask to establish the length of the channel regions between sources 11 and drains 12. In this manner, channel length can be tailored for optimum efficiency of hot carrier injection from the channel region to the floating gate 13.

Figure 3D:
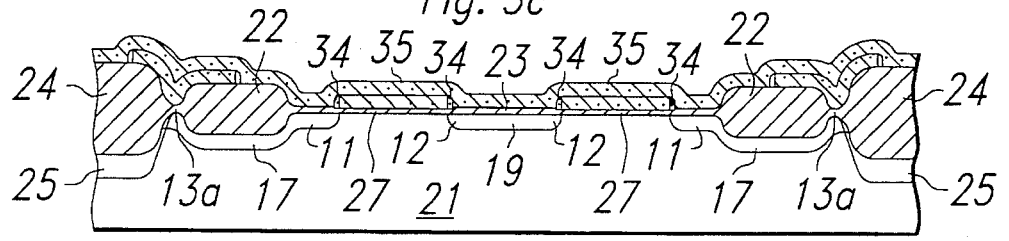

With reference to FIG. 3d, the next step is to implant, on either side of channel-section 29 strips, the shared N+ drain-column lines 19 and columnar N+ source regions 11 adjacent source-column lines 17. The channel-section 29 strips (with the oxide/nitride layer 33 and the photoresist in place) form an implant mask covering the channel regions between sources 11 and drains 12. An arsenic implant is performed at a dosage of about $6 \times 10^{15}$ cm$^{-2}$ at about 135 Kev to create the self-aligned N+ drain-column lines 19 and columnar source regions 11 (which provide the source 11 and drain 12 for each memory cell 10 in the corresponding column of memory-cells 10).

At the channel region, the junctions of the N+ drain-column line 19 and the columnar source regions 11, are self-aligned with the corresponding edges of the overlying channel-section 29 strips. After the arsenic implant, a phosphorous implant of a suitable energy can be used in the columnar source regions 11 (after covering the drain-column line 19 with photoresist), to tailor the source-channel junction for a more sloped junction profile. Using a source-channel junction tailoring implant yields optimum junction profiles by providing a relatively sloped source-channel junction for erasing/reading, without affecting the relatively abrupt drain-channel junction used for programming. The drain 12 junction profiles can be maintained throughout the remainder of the fabrication process by carefully controlling subsequent heat treatment cycles to minimize further drive.

Following the implant of drain-column line 19 and columnar source regions 11, the photoresist is stripped from the tops of the channel-section 29 strips and tunnel-window-section 28 strips, and the substrate 21 is annealed at about 900°–1000° C. for about 30 minutes in an annealing ambient to repair the implant damage and for junction drive.

The N+ implant-drive associated with forming the N+ regions in the implant step results in some diffusion of the arsenic dopant under the corresponding edges of the masking channel sections 29. By controlling the N+ implant-drive, the diffusion of the arsenic dopant into the channel regions, under the channel-section 29 strips, can be minimized, and these drain junctions maintained in fairly abrupt alignment with the corresponding edges of the channel-section 29 strips.

An oxidation step is then performed to grow insulator layers 23 over drain-column lines 19 and columnar source regions 11. This thermal oxidation procedure is performed to grow a few hundred Angstroms of oxide between strips 29, and between strips 29 and thick oxide 22. In addition, oxide grows on the sides of the tunnel-window-section 28 strips and the channel-section 29 strips, forming sidewall oxides 34, shown in FIG. 3d. During this oxidation procedure and during later steps, tunnel windows 13a are protected by tunnel-window section 28.

Figure 3E:
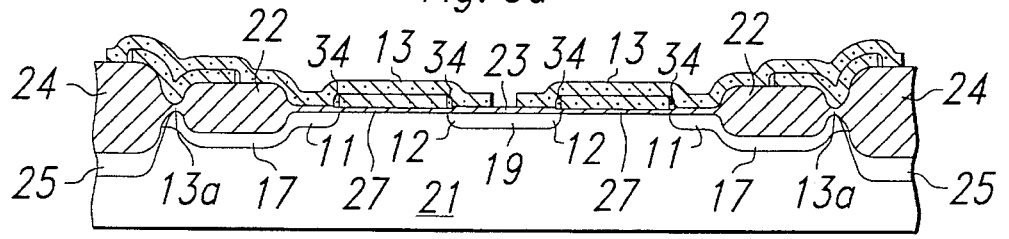

With reference to FIG. 3d, the second stage in forming the floating-gate conductors 13 is now performed. Oxide/nitride layer 33 is removed from sections 28 and 29. A second-level polysilicon layer 35 is then deposited over the face of the slice to a thickness of about 2000 to 4000 Angstroms, and is highly doped N+ to render it conductive. This second-level polysilicon layer 35 is then patterned with photoresist to define the edges of the floating gates above and parallel to cell-isolation thick-field insulators 24 and insulator layer 23. An etch procedure is used to complete the definition of the floating-gate conductors 13 parallel to the source-drain lines as illustrated in FIG. 3e. Definition of floating-gate width in the other direction is accomplished in a later Stack-etch procedure.

The second-level polysilicon layer 35, which will become part of floating gates 13, completely covers, and is in electrical contact with, the polysilicon channel section 29 and the polysilicon tunnel-window section 28, extending over a portion of a drain-column-line insulator layer 23, all of a source-column-line thick-insulator regions 22 and over a portion of a cell-isolation thick-field insulator 24. Thus, each floating-gate conductor 13 includes a channel section 29 capacitively coupled to the channel under gate insulator 27, and a tunnel-window section 28 capacitively coupled to the buried N+ source-column line 17 through a tunnel-window oxide 13a.

Figure 3F:
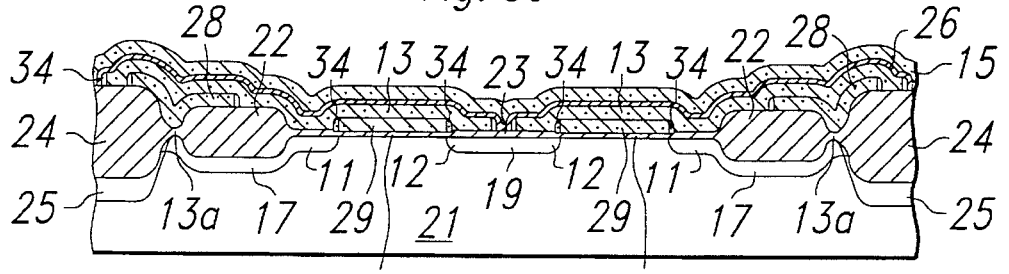

With reference to FIG. 3f, after the floating-gate fabrication, about 3000–5000 Angstroms of oxide is deposited, and anisotropically etched back to create sidewall oxides 34 at the edges of the floating-gate strips 13. An inter-level insulator layer 26 such as oxide/nitride/oxide (ONO) of equivalent oxide (dielectric) thickness in the range of 200–400 Angstroms is formed on the floating-gate 13 layer by conventional techniques.

A third-level polysilicon layer is deposited over the face of the substrate 21 and highly doped N+ to make it conductive. This third-level polysilicon layer is deposited to a thickness of about 2000–4500 Angstroms, and de-glazed. Next, a stack-etch procedure is used to create the wordlines 15 that correspond to rows of memory cell 10 pairs. Photoresist (not shown) is applied to define wordline 15 stacks that include the third polysilicon layer, the inter-level insulator layer 26, and the first-level and second-level polysilicon layers that form columnar floating-gate strips 13, including sections 28 and 29. The stack etch defines a plurality of elongated wordlines 15 running substantially parallel in the wordline 15 direction (see FIG. 2a), defining the width of the floating gates 13 and in particular the width of the channel sections between sources 11 and drains 12.

Thus, the stack etch produces wordline conductors 15 that are continuous in the wordline 15 direction and produces a control gate 14 for each memory cell 10 in each wordline 15 row. The control gate 14 is capacitively coupled to respective underlying floating gates 13 through the corresponding portion of the inter-level insulator 26.

Channel-isolation areas (36 in FIG. 2a) can now be created. The stack-etch procedure can be controlled either to etch down into the gate insulator layer 27, or to trench etch into the silicon substrate 21. After trench etch, the trenches may be filled with oxide according to well-known procedures. If junction isolation is to be used, a self-aligned P+ implant step is performed, using the wordline 15 stack as a mask to create P+ channel stops. For this purpose, boron is implanted at a dose of about $10^{12}$ cm$^{-2}$ at about 70 KeV. After annealing and oxidation, this implant produces P+ channel stops in substantially the same manner as cell-isolation P+ implanted stop regions 25. An oxide is then grown over the P+ channel stops 36 to complete the channel-isolation areas.

Alternatively, these areas can be created in the first field oxide procedure that created the cell-isolation regions 24/25. In this case, elements formed from first-level, second-level, and third-level polysilicon layers and from inter-level insulator layer 26 will overlap the field-oxide region 36.

Peripheral logic CMOS devices may now be completed.

Finally, an oxide layer (not shown) is grown over the face, including over all wordlines 15, and a borophosphosilicate (BPSG) glass layer (not shown) is then deposited. Off-array contacts (not shown) are made through the BPSG layer, as are on-array contacts that are made from metal bitlines (not shown) to respective diffused source/drain-column lines 17 and 19. The metal bitlines are formed on the BPSG layer to run over and parallel to the respective diffused bitlines.

The injection-program/tunnel-erase EEPROM cell 10 of this invention provides an EEPROM memory cell 10 that is electrically programmable using hot-carrier injection (channel-hot electrons and avalanche-breakdown electrons), and is electrically erasable using Fowler-Nordheim tunneling. The invention takes advantage of the lower programming voltages required for hot-carrier injection, while avoiding disadvantageous channel-oxide damage caused by hot-carrier erasure.

The memory cell 10 uses a floating-gate structure that includes a channel section 29 and a tunnel-window section 28. The floating-gate channel section 29 is formed over the channel region, being of a predetermined length corresponding to the desired length of the channel region. The source/drain 11,12 junctions are self-aligned with the edges of the floating-gate channel section to establish channel length. Junction and channel tailoring implants are used to optimize the junction and channel profiles for maximum programming and reading efficiency.

The floating-gate tunnel-window section 29 is capacitively coupled to a tunnel-window subregion of the buried N+ source-column lines 17 through a thin tunnel-window insulator 13a (about 100 Angstroms of oxide). The tunnel-window section, and therefore the tunnel window, are located on the side of the source-column line 17 opposite the source-channel junction, which terminates under oxide that is thicker than the tunnel oxide, thereby enhancing source-junction field-plate breakdown voltage (and inhibiting hot-carrier erasure).

Although the present invention has been described with respect to a specific, preferred embodiment, various changes and modifications may be suggested to one skilled in the art, and it is intended that the present invention encompass such changes and modifications as fall within the scope of the appended claims.

I claim:

1. A method of fabricating a nonvolatile memory cell at the face of a semiconductor substrate of a first conductivity-type, comprising:

creating a source-column line by selectively implanting a dopant of a second conductivity-type opposite said first conductivity-type in said substrate;

forming a thick insulator over said source-column line;

forming a thin tunnel-window insulator over said source-column line;

forming a first conductive layer and an underlying gate insulator layer over said face of said substrate;

selectively etching said first conductive layer to define a channel-section strip and to define a tunnel-window-section strip;

using said channel-section strip as an implant mask, selectively implanting a first dopant of a said second conductivity-type to create a source region adjacent said source-column line and along one edge of said channel-section strip and to create a drain-column line, including a drain region, along an opposite edge of said channel-section strip;

forming insulator regions over said source region and said drain-column line;

forming a second conductive layer over said face of said substrate;

selectively etching said second conductive layer to define a parallel floating-gate connecting-section strip extending over and electrically connected to said channel-section strip and extending over and electrically connected to said tunnel-window-section strip;

forming a thin inter-level insulator layer and a third conductive layer over said face of said substrate; and stack etching said first, second and third conductive layers, and said inter-level insulator layer, to define a control gate and a floating gate.

2. The method of claim 1, wherein, in the step of implanting a dopant to create said drain region, arsenic ions are utilized.

3. The method of claim 1, including the step of selectively implanting in said substrate a dopant of said first conductivity-type for adjusting the voltage threshold of said memory cell.

4. The method of claim 1, including the step of selectively implanting in said source region a second dopant, wherein said second dopant consists of phosphorous ions.

5. The method of claim 1, wherein said gate insulator layer is thicker than said thin tunnel window insulator.

6. The method of claim 1, wherein said inter-level insulator layer is formed by a three-insulator oxide-nitride-oxide layer.

7. A method of fabricating a nonvolatile memory cell at the face of a semiconductor layer having a first conductivity-type, comprising:

implanting a dopant of a second conductivity-type opposite said first conductivity-type to create a source-column line in said substrate;

forming a thick insulator area over said source-column line;

forming a thin tunnel-window insulator layer over said source-column line;

forming a floating-gate channel section insulated from said substrate by a gate-insulator layer and forming a floating-gate tunnel-window section over said thin tunnel-window insulator;

implanting a dopant of a said second conductivity type opposite said first type to create a source region adjacent said source-column line at one edge of said floating-gate channel section and to create a drain region at an opposite edge, thereby defining a channel region in said substrate between said source and drain regions;

forming insulator regions over said source region and said drain region;

forming a floating-gate connecting section that extends over and connects to said floating-gate channel section and extends over and connects to said floating-gate tunnel-window section;

forming an inter-level insulator layer over said floating-gate;

forming a control-gate over said inter-level insulator layer.

8. The method of claim 7, wherein, in the step of implanting a dopant to create said drain region, arsenic ions are utilized.

9. The method of claim 7, including the step of implanting dopant through said tunnel-window insulator into an extended region of said source-column line.

10. The method of claim 7, wherein said inter-level insulator layer is formed as a three-insulator oxide-nitride-oxide layer.

* * * * *